United States Patent [19]

Masuda et al.

[11] Patent Number: 4,976,810
[45] Date of Patent: Dec. 11, 1990

[54] METHOD OF FORMING PATTERN AND APPARATUS FOR IMPLEMENTING THE SAME

[75] Inventors: Satoshi Masuda, Tokyo; Fumiaki Shigemitsu; Kinya Usuda, both of Yokohama, all of Japan

[73] Assignee: Kabushiki Kaisha Toshiba, Kawasaki, Japan

[21] Appl. No.: 489,231

[22] Filed: Mar. 6, 1990

[51] Int. Cl.[5] .......................... B44C 1/22; C23F 1/02; C03C 15/00; C03C 25/06
[52] U.S. Cl. ................................. 156/659.1; 156/640; 156/656; 156/345; 252/79.2; 430/5; 430/296; 430/318; 430/323
[58] Field of Search ............ 156/628, 640, 656, 659.1, 156/345; 430/5, 296, 313, 318, 323; 252/79.2

[56] References Cited

FOREIGN PATENT DOCUMENTS 56-146137 11/1981 Japan .
57-176040 10/1982 Japan .
58-21739   2/1983 Japan .
58-33246   2/1983 Japan .

OTHER PUBLICATIONS

M. Kataoka, "Positive Type Electron Beam Resist", Electronic Material, Sep. 1989, pp. 61–72.

Primary Examiner—William A. Powell
Attorney, Agent, or Firm—Foley & Lardner, Schwartz, Jeffery, Schwaab, Mack, Blumenthal & Evans

[57] ABSTRACT

Prior to etching by an etchant, a low concentration solution of cerium ammonium nitrate [$(NH_4)_2Ce(NO_5)_6$] is caused to adhere onto an electron-beam resist pattern, thus to improve hydrophilic property of the resist pattern. As a result, a metal thin film is etched in conformity with the resist pattern. Thus, a fine pattern of the metal thin film is provided.

19 Claims, 5 Drawing Sheets

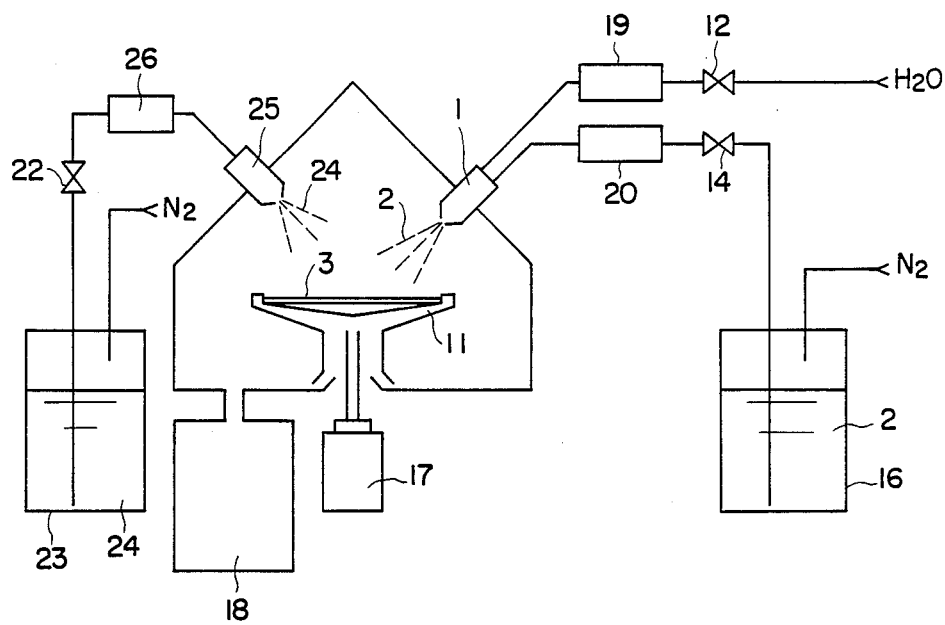
F I G. 4
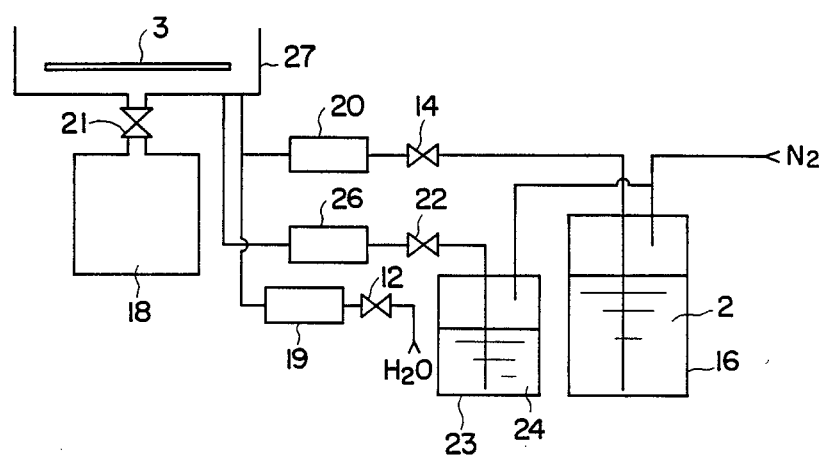
F I G. 5

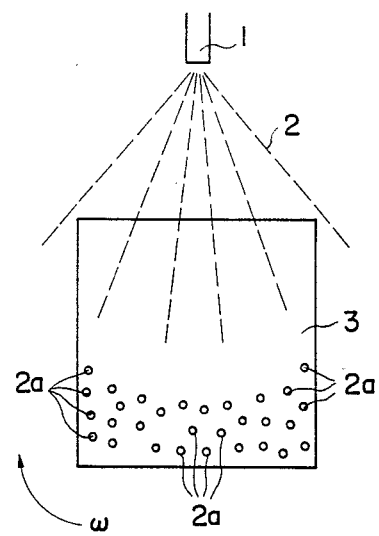
F I G. 8
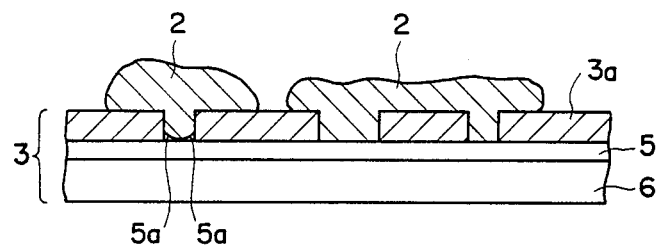
F I G. 9A
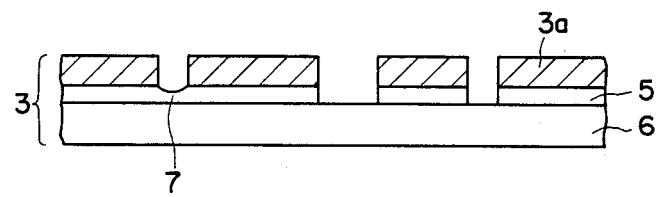
F I G. 9B

METHOD OF FORMING PATTERN AND APPARATUS FOR IMPLEMENTING THE SAME

FIELD OF THE INVENTION

This invention relates to a method of forming a pattern and an apparatus therefor, and more particularly to a method of forming a pattern by wet etching for forming a fine pattern of a metal thin film on a substrate to be processed such as a semiconductor substrate or a mask substrate, etc. and an apparatus for implementing such a method.

BACKGROUND OF THE INVENTION

An explanation will be made by taking an example of a pattern formation method using an electron beam resist (a resist responsive to an electron beam). Namely, the method of forming a pattern by an electron beam resist ordinarily includes the steps of coating a resist on a metal thin film or a semiconductor substrate, writing a desired pattern by irradiating an electron beam to the resist film, developing the resist pattern thereafter to etch the metal thin film or the semiconductor substrate using the resist pattern as a mask, and exfoliating the useless resist. A further detailed explanation will be made by taking an example of a method of forming a pattern. Namely, a film of chromium or a film of chromium and chromium oxide is formed on a transparent glass substrate by vacuum deposition or sputtering to coat an electron beam resist on the film to write a pattern on the resist while scanning a circular electron beam in accordance with writing pattern data. Then, the resist is developed so that the written pattern is provided thereafter to selectively etch the chromium film by an etchant or etching liquid using the pattern of the resist as a mask, thus to form a chromium pattern. Finally, the unnecessary resist film is exfoliated to form a mask pattern.

Many electron beam resists are comprised of a fluoride system. While such resists have a high sensitivity with respect to the electron beam, they are disadvantageous in strong hydrophobic property (an angle in contact with water is substantially equal to 90 degrees). For this reason, when a spray wet etching is implemented using the resist pattern as a mask, the etchant is repelled on the surface of the resist because of poor wetness, resulting in water drops. Under this state, etching proceeds, leading to various drawbacks.

Namely, FIG. 8 is an explanatory view showing, in a model form, an example as to how such a spray wet etching is carried out. In FIG. 8, reference numeral 1 denotes a nozzle for an etchant. An etchant 2 is ejected in a spray manner from the nozzle 1. The sprayed etchant 2 falls on resists 3a of a mask substrate 3. This resist 3 is patterned, e.g., as shown in FIG. 9A. The resists 3 thus patterned are provided on a glass substrate 6 through a chromium thin film 5. When the etchant 2 falls on such resists 3a as a spray, the etchant takes the form of drops 2a resulting from the hydrophobic property of the resist 3a. As a result, not only development of etching becomes unevenness within the plane, but also there occur portions 5a which are not in contact with the etchant (2a) of the fine chromium exposed portion as shown in FIG. 9A, so poor wetness (the etchant does not come into contact the surface of the chromium thin film 5 because the resist 3a is in a repelled state) is apt to take place. When the resist pattern is a pattern having a small ratio of exposed portion of chromium thin film 5, or when the resist pattern is a fine and complicated pattern, such a phenomenon will be apt to occur. In addition, once a poor wetness occurs during etching, a chromium remainder 7 is caused to occur as shown in FIG. 9B. Namely, the film of chromium 5 is not completely etched, so it is left as the chromium remainder 7. As a result, a desired chromium pattern is not provided.

Also in the case of carrying out, e.g., etching by the immersion system into an etchant except for the above-mentioned spray etching, a difficulty similar to the above occurs.

Namely, FIG. 10 is an explanatory view showing, in a model form, an example of etching by the immersion system. In FIG. 10, reference numeral 8 is a liquid bath for etching in which etchant 2 is contained. When mask substrate 3 is immersed into the etchant 2, bubbles 4 adhere on the surface of the resist 3a, so a poor wetness will take place. Thus, it is difficult to provide a fine chromium pattern for the same reason as that in the case of FIG. 8.

As the method of preventing occurrence of the above-mentioned poor wetness, there have been carried out a method of using an etchant including a surface active agent, and a method of immersing a developed glass substrate into a surface active agent immediately before etching thereafter to carry out etching. However, even with these methods, the chromium being left unetched cannot be completely prevented to result in the occurrence of the chromium remainder 7.

SUMMARY OF THE INVENTION

This invention has been made in view of the above and its object is to provide a pattern formation method and apparatus capable of providing a fine pattern by a metal thin film as a proper pattern even in the case where the metal thin film is etched using a pattern having a strong hydrophobic property as a mask.

In this invention, the resist pattern is caused to have a hydrophilic property by a surface property modifying agent. For this reason, when the metal thin film is etched by an etchant using that resist pattern as a mask, the wetness of the etchant with respect to the resist pattern is improved, resulting in no possibility that bubble adheres on the surface of the resist pattern. As a result, even in the case where a pattern concerned is fine, the metal thin film is precisely etched in conformity with that resist pattern. A desired metal thin film pattern is therefore formed.

In accordance with this invention, the surface of the resist pattern is caused to have a hydrophilic property prior to etching thereafter to carry out etching. As a result, the etchant satisfactorily becomes in harmony with the resist surface, so that the etchant spreads uniformly over the entirety of the resist surface and etching is carried out under the condition of the stable and homogeneous characteristic. Thus, the formation of a fine pattern can be easily carried out.

BRIEF DESCRIPTION OF THE DRAWINGS

In the accompanying drawings:

FIGS. 4 to 7 are explanatory diagrams showing different examples of apparatus used in the implementation of this invention, respectively;

FIG. 8 is an explanatory view showing the spray wet etching state of the background art;

FIGS. 9A and 9B are explanatory views as different enlarged cross sections showing how the mask substrate is etched by etching process, respectively.

DESCRIPTION OF THE PREFERRED EMBODIMENTS

Prior to the description of preferred embodiments of this invention, the particulars up to the completion of this invention will be first explained. As a result of the fact that the inventors have continuously conducted studies in order to provide a fine pattern of the metal thin film, they have found out that, prior to etching by an etchant, when a solution of serium ammonium nitrate [$(NH_4)_2Ce(NO_5)_6$] having a low concentration is caused to adhere on the electron beam resist pattern, the hydrophilic property of the resist pattern is improved and the metal thin film is properly etched in conformity with the resist pattern, whereby a fine pattern of the metal thin film can be provided This invention has been made by conducting various experiments, etc. on the basis of findings by the inventors as stated above.

Figure 1:
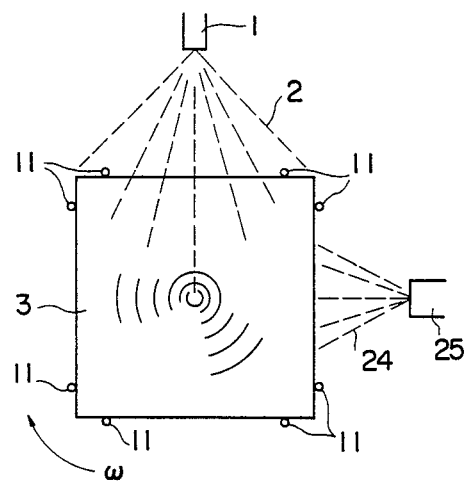
FIG. 1 is a schematic explanatory view of an apparatus used in the implementation of this invention.
Figure 10:
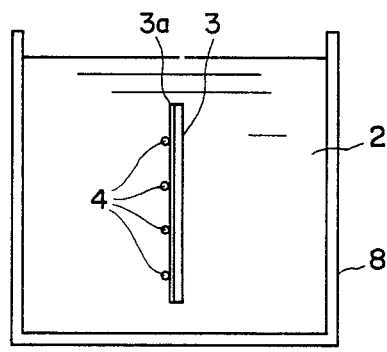
FIG. 10 is an explanatory view showing the immersion wet etching process of the background art.

By taking an example of formation of a mask pattern using, as an electron beam resist, 2,2,2-trifluoroethyl-α-chloroacrylate (Trade name: EBR-9) hereinafter referred to as EBR-9), an embodiment of this invention will be described with reference to FIG. 1. In FIG. 1, the portions equivalent to those in FIG. 8 are designated by the same reference numerals as those in FIG. 8, respectively. First, EBR-9 is coated on a mask substrate 3 formed by vacuum-depositing (sputtering) a film of chromium or film of chromium and chromium oxide on a transparent glass substrate. Thereafter, a pattern is written on the EBR-9 by an electron-beam writing device. When this EBR-9 is developed after writing, portions of EBR-9 to which an electron-beam is irradiated are selectively removed. Thus, a pattern of the resist (EBR-9) is formed. Thereafter, as shown in FIG. 1, the mask substrate 3 is set at the etching system and is fixed by means of pawls 11. While rotating the mask substrate 3 in the direction indicated by an arrow, a surface property modifying agent 24 including, as a major component, cerium ammonium nitrate $(NH_4)_2Ce(NO_5)_6$ is first ejected and dropped downward from a nozzle 25. Thus, the surface of the resist 3 is caused to have hydrophilic property. Thereafter, while rotating the mask substrate 3, the etchant 2 is ejected from the nozzle 1. Wet etching is therefore conducted. As this etchant, e.g., an etchant having a composition of $(NH_4)_2Ce(NO_5)_6$ of 125 g, perchloric acid of 53 cc, and water of 945 cc may be used. It is to be noted that an approach may be employed in this case to stop the rotation of the mask substrate 3 immediately after the etchant 2 is ejected to conduct an etching in that stationary state.

Since the surface of the resist 3 is etched after hydrophilic property is rendered thereto, a proper etching is carried out without affecting the ejecting position of the etchant 2 and the liquid pressure thereof. Namely, the attachment of bubbles on the surface of the mask substrate 3 does not occur. Furthermore, even if the resist pattern is extremely fine, the chromium thin film below the resist mask is etched with high precision as a result of the fact that the surface of the resist 3 is caused to have a hydrophilic property.

Figure 2:
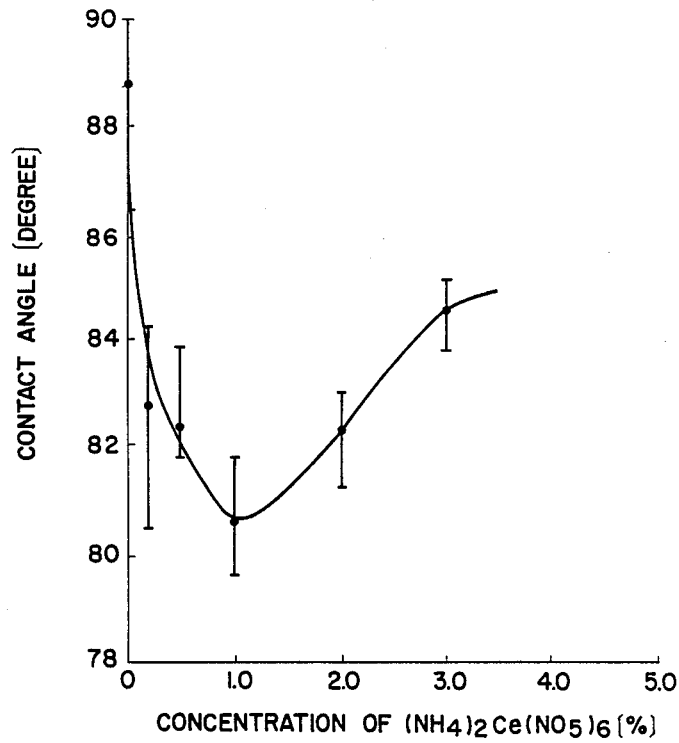
FIG. 2 is a concentration characteristic diagram of a surface hydrophilic rendering effect (contact angle)
Figure 3:
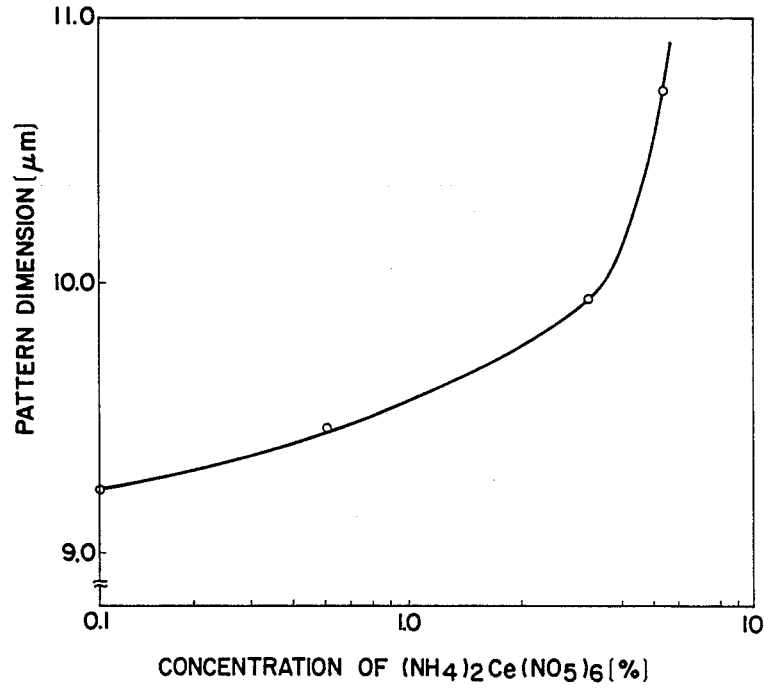
FIG. 3 is an etching characteristic diagram showing the relationship between the concentration of cerium ammonium nitrate as a surface property modifying agent and the dimension of a pattern obtained by etching carried out after that agent is added.

FIG. 2 shows a characteristic curve showing the relationship between a weight ratio (weight percent concentration) of cerium ammonium nitrate to water and a contact angle on the resist surface in the case of varying that weight ratio in the above-mentioned surface property change agent, which has been obtained by the inventors by experiment. In FIG. 2, lines extending in the upper and lower directions of the respective dots represent scattering ranges of measured values FIG. 3 shows the result obtained by the inventor by an experiment in connection with the relationship between changes in the concentration of cerium ammonium nitrate and changes in the dimension of the Cr pattern (width of the pattern) obtained by the subsequent etching in the case of using cerium ammonium nitrate having a certain concentration, i.e., the hydrophilic effect of the surface property modifying agent. In more detail, FIG. 3 shows the value of the etched width (pattern dimension) of the Cr thin film in the case of forming a pattern having grooves 10 μm wide by resist on a Cr thin film (thickness of 0.1 μm) to rinse the surface of that resist with a cerium ammonium nitrate having a certain concentration to thereby allow it to have a hydrophilic property, and thereafter to etch the hydrophilic resist surface with an etchant. It is judged from the above-mentioned curves shown in FIGS. 2 and 3 that the concentration of the cerium ammonium nitrate effective as a surface property modifying agent falls within a range of weight ratio of 0.5 to 2% with respect to water. Namely, it is seen that the hydrophilic property rendering effect becomes maximum and the etching effect of the surface property modifying agent becomes small within this range.

FIG. 4 shows the detail of the apparatus shown in FIG. 1 used for implementing the above-mentioned method. In FIG. 4, the same components as those in FIG. 1 are designated by the same reference numerals as those in FIG. 1, respectively. The mask substrate 3 fixed by means of pawls 11 can be rotated by a substrate rotating motor 17. Cleaning water is delivered through a valve 12 and a flow rate controller 19 to the nozzle 1 for ejecting an etchant 2 onto the substrate, and the etchant 2 within a pressure tank 16 pressurized by $N_2$ is delivered through a valve 14 and a flow rate controller 20 to the above-mentioned nozzle 1. It is a matter of course that water and the etchant are separately delivered to the nozzle 1. A surface property modifying agent 24 within a pressure tank 23 pressurized by $N_2$ is delivered through a valve 22 and a flow rate controller 26 to a nozzle 25 for ejecting the surface property modifying agent 24 onto the substrate 3. A waste liquid or solution is collected into a tank 18 for collecting waste liquid.

FIG. 5 shows an apparatus for immersing the glass substrate 3 into the liquid bath to carry out the etching processing. In FIG. 5, members equivalent to those in FIGS. 1 and 4 are designated by the same reference numerals as those in these figures, respectively. The mask substrate 3 is accommodated within a liquid bath 27. The surface property modifying agent 24 within a pressure tank 23 pressurized by $N_2$ is first delivered through the valve 22 and the flow rate controller 26 into the liquid bath 27. In this way, the mask substrate 3 is immersed into the surface property modifying agent 24. Thus, the resist on the surface of the mask substrate 3 is caused to have a hydrophilic property. Thereafter, the surface property modifying agent 24 within the liquid bath 27 is collected through a valve 21 into the tank 18 for collecting waste liquid. Then, the etchant 2 within the pressure tank 16 pressurized by $N_2$ is delivered through the valve 14 and the flow rate controller 20 into the liquid bath 27. Thus, etching of the mask substrate 3 which has been caused to be hydrophilic is carried out. After etching, the etchant 2 is collected through the valve 21 into the tank 18 for collecting waste liquid.

Even with this method, since the resist surface is caused to be hydrophilic in advance by the surface property modifying agent, etching is satisfactorily carried out without adhesion of bubbles.

It has been described in the above-mentioned embodiments that different liquids are used as the etchant and the surface property modifying agent, respectively. It will now be described that a liquid or solution having a certain concentration is used as the etchant as it is and also the surface property modifying agent after dilution thereof.

Namely, as the etchant, there is a Cr etchant comprising cerium ammonium nitrate. The inventors have learned that even if an etchant contains a liquid including strong acid (perchloric acid) in addition to cerium ammonium nitrate and water, when the concentration of cerium ammonium nitrate is the same concentration as that previously described with reference to FIGS. 2 and 3, i.e., the weight percentage with respect to water is 0.5 to 2%, such an etchant functions as a surface property modifying agent. Thus, if a method is employed to add water to the Cr etchant comprising the cerium ammonium nitrate so as to indicate a low concentration of 0.5 to 2% to use it as a surface property modifying agent at the first stage, thereafter to use the Cr etchant itself as an etchant having a concentration of, e.g., 10% without adding water, the same effects and advantages as in the above-described embodiments where two kinds of liquids are used can be provided.

Figure 6:
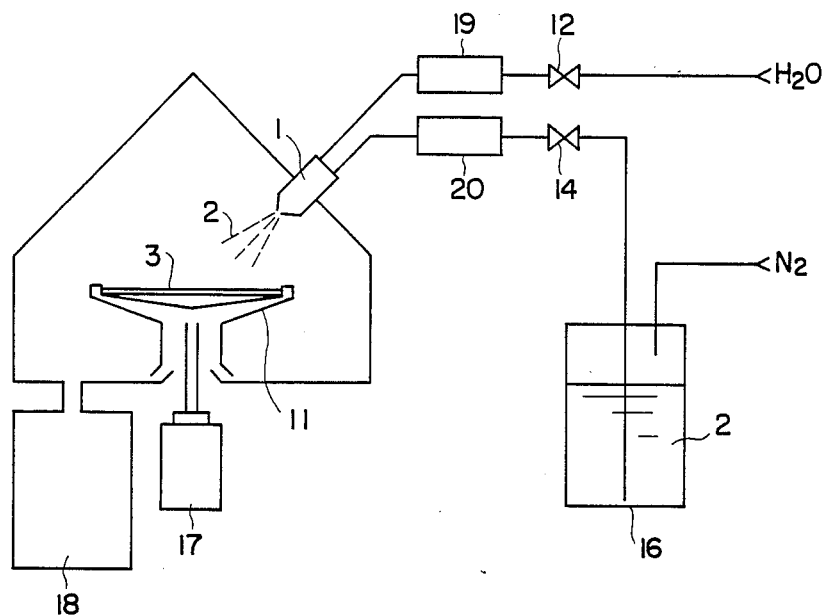
Figure 7:
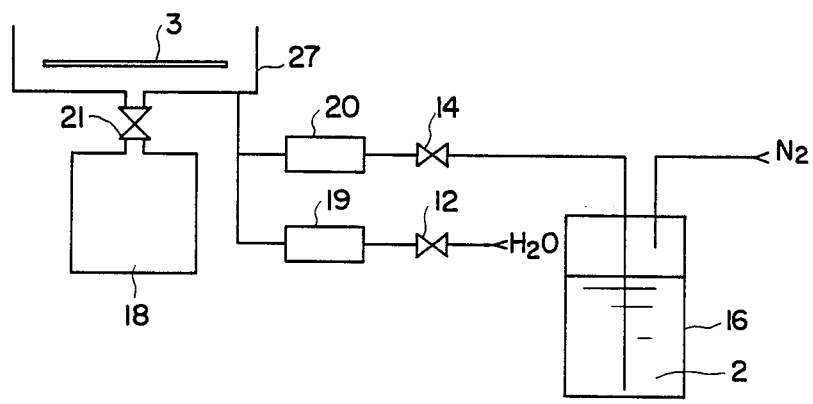

FIGS. 6 and 7 show examples of different apparatus in the case of using one kind of liquid as two liquids of different purposes by changing the concentration of the one kind of liquid, respectively, wherein the apparatus shown in FIG. 6 is of the rotary type which corresponds to the apparatus shown in FIG. 4 and the apparatus shown in FIG. 7 is of the liquid bath type which corresponds to the apparatus shown in FIG. 5. In FIGS. 6 and 7, components identical to those in FIGS. 1, 4 and 5 are designated by the same reference numerals as those in those figures, respectively.

In FIG. 6, in ejecting, from the nozzle 1, an etchant (a Cr etchant of the cerium ammonium nitrate) 2, at the beginning, the etchant 2 is ejected onto the mask substrate 3 as an etchant caused to have a low concentration by water added through the valve 12 and the flow rate controller 19, i.e., as a surface property change agent. Thus, the resist on the surface of the mask substrate 3 is allowed to be hydrophilic. Thereafter, the above-mentioned etchant 2 is ejected from the nozzle 1 as an etchant having a high concentration, i.e., as an etchant having an etching effect peculiar thereto.

In FIG. 7, the mask substrate 3 is accommodated within the liquid bath 27. The etchant 2 delivered into the liquid bath 27 is adjusted by water flowing thereinto through the valve 12 and the flow rate controller 19 so that it has a low concentration. At the beginning, an etchant 2 having a low concentration is delivered as a surface property modifying agent into the liquid bath 27, thus allowing the resist on the surface of the mask substrate 3 to be hydrophilic. Thereafter, an etchant 2 having a high concentration is delivered for the implementation of etching.

In accordance with the above-described respective embodiments, even in the case of forming a pattern using a resist having a strong hydrophobic property, the advantages of elimination of the metal thin film remainder and the pattern missing failure at the time of etching, in-plane defect density suppressed to an extremely low value, considerably improved quality and yield, and improved working efficiency can be provided.

It is a matter of course that this invention can be applied to the formation of a pattern of a metal thin film on a semiconductor substrate.

It is to be noted that PMMA (polymethyl methacrylate) may be used as the electron beam resist.

We claim:

1. A method of forming a pattern includes:
 a step of forming a resist film on a metal thin film subject to etching formed on a substrate;
 a step of patterning said resist film to provide a resist pattern;
 step of allowing said resist pattern to have hydrophilic property by a surface property modifying agent including cerium ammonium nitrate [$(NH_4)_2Ce(NO_5)_6$] as a major component; and
 a step of etching said metal thin film by an etchant using said resist pattern caused to have hydrophilic property as a mask.

2. A method as set forth in claim 1, wherein said surface property modifying agent includes the cerium ammonium nitrate of which the weight percentage is 0.5 to 2% with respect to water.

3. A method as set forth in claim 1, wherein said resist film is formed by 2,2,2-trifluoroethyl-α-chloroacrylate.

4. A method as set forth in claim 3, wherein said patterning is carried out by the irradiation of an electron beam.

5. A method as set forth in claim 1, wherein said resist film is formed by polymethyl methacrylate.

6. A method as set forth in claim 1, wherein said metal thin film is formed by a metal of the chromium system.

7. A method as set forth in claim 6, wherein said etchant has a composition of cerium ammonium nitrate of 125 g, perchloric acid of 53 cc, and water of 945 cc.

8. A method as set forth in claim 6, wherein said substrate is comprised of a glass substrate and a metal thin film of chromium system is formed on said substrate by sputtering.

9. A method as set forth in claim 1, wherein said surface property modifying agent and said etchant are sprayed onto said resist pattern and said metal thin film.

10. A method as set forth in claim 9, wherein said substrate is rotated substantially about the center of said substrate in a plane including said substrate at least at the time of spraying said surface property modifying agent.

11. A method as set forth in claim 1,
 wherein the process step of allowing the resist to have a hydrophilic property is carried out by immersing said substrate into said surface property change agent, and wherein said etching is implemented by immersing said substrate into said etchant.

12. A method as set forth in claim 1,
   wherein a Cr etchant with cerium ammonium nitrate [$(NH_4)_2Ce(NO_5)_6$] is used as said etchant, and
   wherein a liquid obtained by diluting said etchant by water is used as said surface property modifying agent.

13. A method as set forth in claim 12, wherein said surface property modifying agent includes cerium ammonium nitrate of which the weight percentage is 0.5 to 2% with respect to water.

14. An apparatus for forming a pattern comprising:
   means for rotating a substrate to which patterning of a resist film coated onto a metal thin film on said substrate has been implemented about substantially the center of said substrate in a plane including said substrate;
   first spray means for spraying, onto said substrate, a surface property modifying agent including, as a major component, cerium ammonium nitrate [$(NH_4)_2Ce(NO_5)_6$]; and
   second spray means for spraying, onto said substrate, an etchant for etching said metal thin film with said resist film to which patterning has been implemented.

15. An apparatus as set forth in claim 14, wherein different liquids are used as said surface property modifying agent and said etchant, respectively, said apparatus further including two tanks for individually accommodating said surface property modifying agent and said etchant, respectively.

16. An apparatus as set forth in claim 14, wherein a Cr etching liquid with the cerium ammonium nitrate is used commonly as said surface property modifying agent and said etchant, said first spray means being adapted to spray a liquid obtained by adding water to said Cr etching liquid, said second spray means being adapted to spray said Cr etching liquid as it is.

17. An apparatus for forming a pattern comprising:
   a tank for accommodating a substrate to which patterning of a resist film sprayed onto a metal thin film on said substrate has been implemented;
   first injection means for injecting, into said tank, a surface property modifying agent including cerium ammonium nitrate [$(NH_4)_2Ce(NO_5)_6$] as a major component; and
   second injection means for injecting, into said tank, an etchant for etching said metal thin film using said resist to which patterning has been implemented as a mask.

18. An apparatus as set forth in claim 17, wherein different liquids are used as said surface property modifying agent and said etchant, respectively, said apparatus further including two tanks for individually accommodating said surface property modifying agent and said etchant, respectively.

19. An apparatus as set forth in claim 17, wherein a Cr etching liquid of the cerium ammonium nitrate system is used commonly as said surface property modifying agent and said etchant, said first injection means being adapted to inject a liquid obtained by adding water to said Cr etching liquid, said second injection means being adapted to inject said Cr etching liquid as it is.

* * * * *